(12) United States Patent
Tam

(10) Patent No.: US 9,305,651 B1
(45) Date of Patent: Apr. 5, 2016

(54) EFFICIENT WIDE RANGE BIT COUNTER

(71) Applicant: SanDisk Technologies Inc., Plano, TX (US)

(72) Inventor: Eugene Jinglun Tam, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/492,697

(22) Filed: Sep. 22, 2014

(51) Int. Cl.
| | |
|---|---|
| *G11C 16/06* | (2006.01) |
| *G11C 16/10* | (2006.01) |
| *G11C 16/34* | (2006.01) |
| *G11C 16/26* | (2006.01) |

(52) U.S. Cl.
CPC ............ *G11C 16/10* (2013.01); *G11C 16/26* (2013.01); *G11C 16/3459* (2013.01)

(58) Field of Classification Search
CPC ..... G11C 16/10; G11C 16/26; G11C 16/3459
USPC ....................................... 365/185.22, 185.23
See application file for complete search history.

(56) References Cited

U.S. PATENT DOCUMENTS

| | | | | |
|---|---|---|---|---|
| 8,305,807 | B2* | 11/2012 | Shah ..................... | G11C 29/02 365/185.09 |
| 9,141,534 | B2* | 9/2015 | D'Abreu ............. | G06F 12/0246 |
| 9,165,683 | B2* | 10/2015 | Tam .................. | G11C 29/50004 |
| 2014/0269069 | A1* | 9/2014 | D'Abreu ................ | G11C 16/16 365/185.11 |

OTHER PUBLICATIONS

U.S. Appl. No. 13/925,662, entitled "High Capacity Select Switches for Three-Dimensional Structures," filed Jun. 24, 2013, 36 pages.

* cited by examiner

*Primary Examiner* — Toan Le
(74) *Attorney, Agent, or Firm* — Sterne, Kessler, Goldstein & Fox PLLC

(57) ABSTRACT

An efficient wide range bit counter is presented that can support a wide range of counts with scientific notation. The counting scheme is dynamically altered to maintain a balance between accuracy and performance and allows early termination to fit timing budgets. Two (or more) counters each track the number of occurrences of a corresponding subset of events, where, when none of the counters have reached their capacities, the total count is the sum of the counts for the subsets. If one of the counters reaches it capacity, the other counter is then used as an extension of this first counter and the total count is obtained by scaling the count of the extended counter. In case of early termination, the accumulated count can be compensated to approximate the full count.

16 Claims, 12 Drawing Sheets

Programming into four states represented by a 2-bit code

FIG. 15    FIG. 16A    FIG. 16B

EFFICIENT WIDE RANGE BIT COUNTER

BACKGROUND

This application relates to the counter circuits for recording the number of occurrences of an event on an integrated circuit.

Integrated circuits of many sorts of need to keep track of the number of occurrences of various events. For example, non-volatile memory circuits often need to track of the number of program-erase cycles or the number of times elements have been read for purposes of wear levelling or determining when to perform data scrub operations. In NAND flash memory, error bits counting is important for features such as: deciding the stop point of programming; deciding stop point of program verify; deciding programming start voltage; deciding error bits for test; deciding dynamic read levels; detecting word line failures; and so on.

In many such applications, the number of bits that need to be counted can be quite large. However the counting of these bits consumes test time or operation time, directly degrading system performance and increasing test cost. In these cases, the time to reach the count is often more important than having the count accurate to a high number of significant digits.

SUMMARY

An event counter circuit is formed on an integrated circuit includes first and second counters and logic circuitry. The first counter has a first capacity connected to count the number of occurrences of a first sub-set of a first event and the second counter has a second capacity connected to count the number of occurrences of a second sub-set of the first event. The logic circuitry is connected to the first and second counters and provides the count of the number of occurrences of the first event as the sum of the values of first and second counter when neither has reached their respective capacity. In response to one of the first and second counters reaching its respective capacity, the other of the first and second counters is used as an extension of the first one, where the logic circuitry then provides the count of the number of occurrences of the first event as the values of the first one of the first and second counters scaled according to their relative capacities.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 15 illustrates having the count broken up into multiple ranges, where each range is scanned and counted sequentially.

FIGS. 16A and 16B respectively illustrate the handling of a time-out or abort request.

DETAILED DESCRIPTION

Memory System

Figure 1:
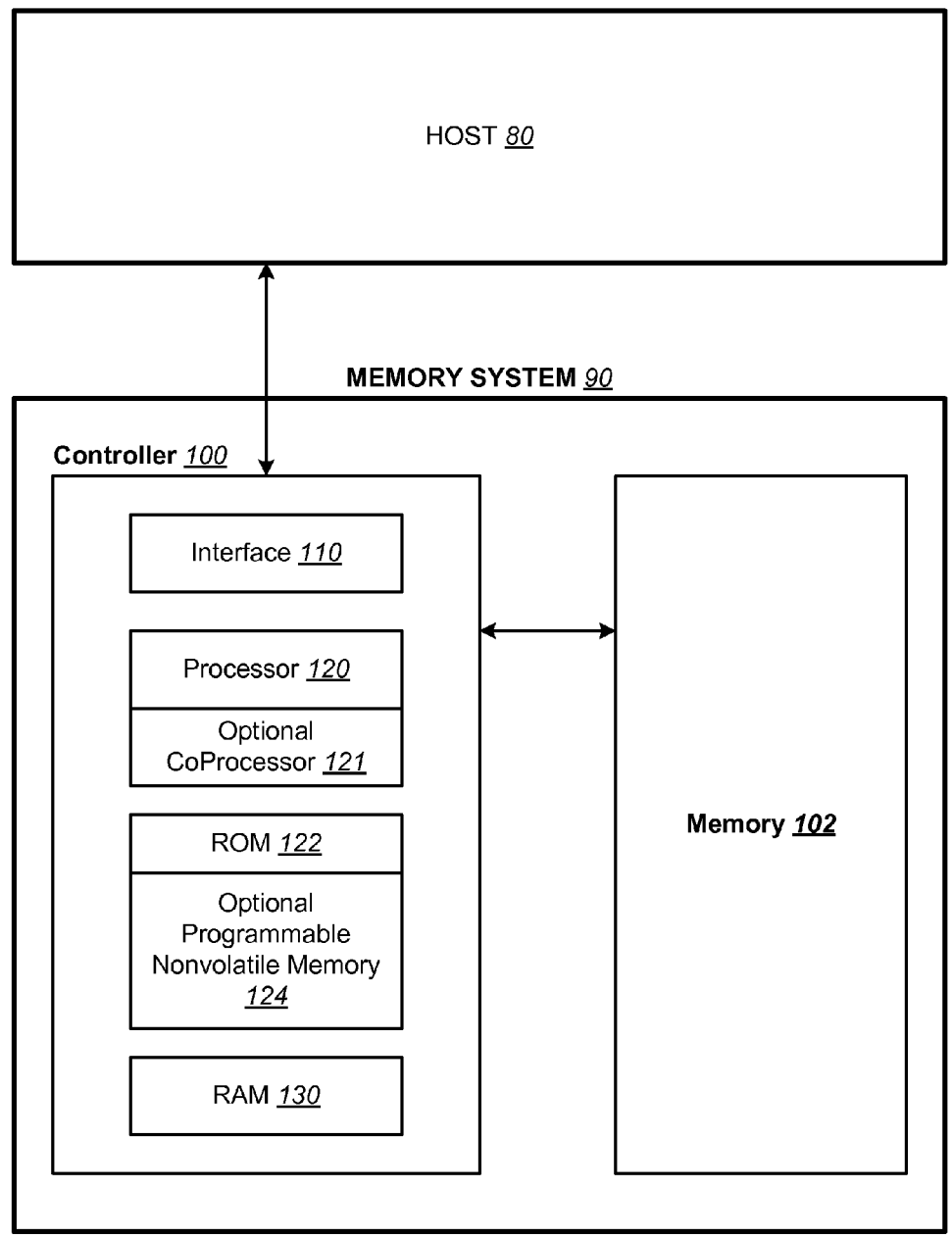
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein.

Physical Memory Structure

Figure 2:
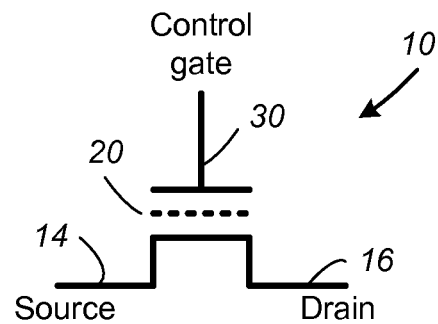
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
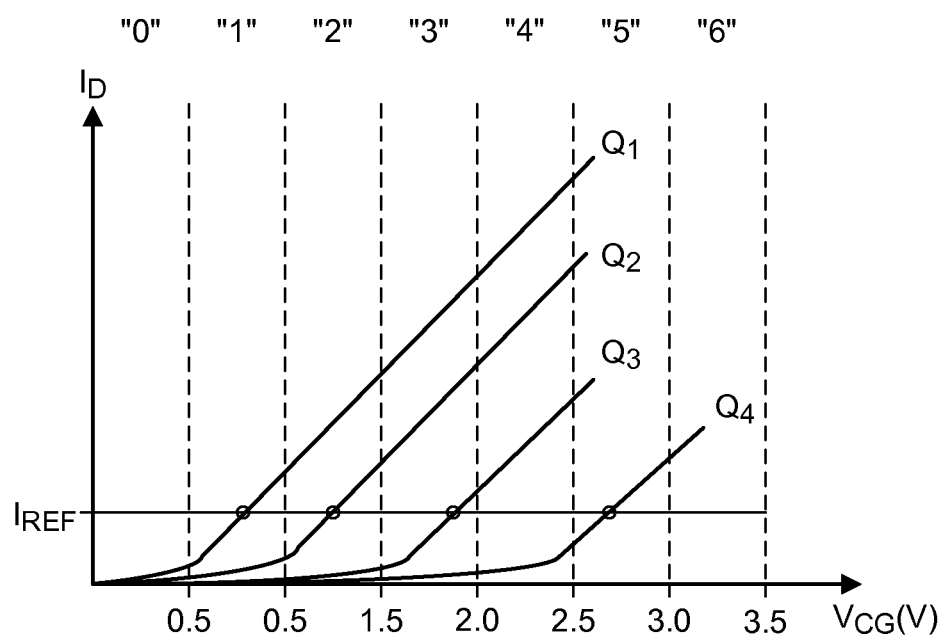
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
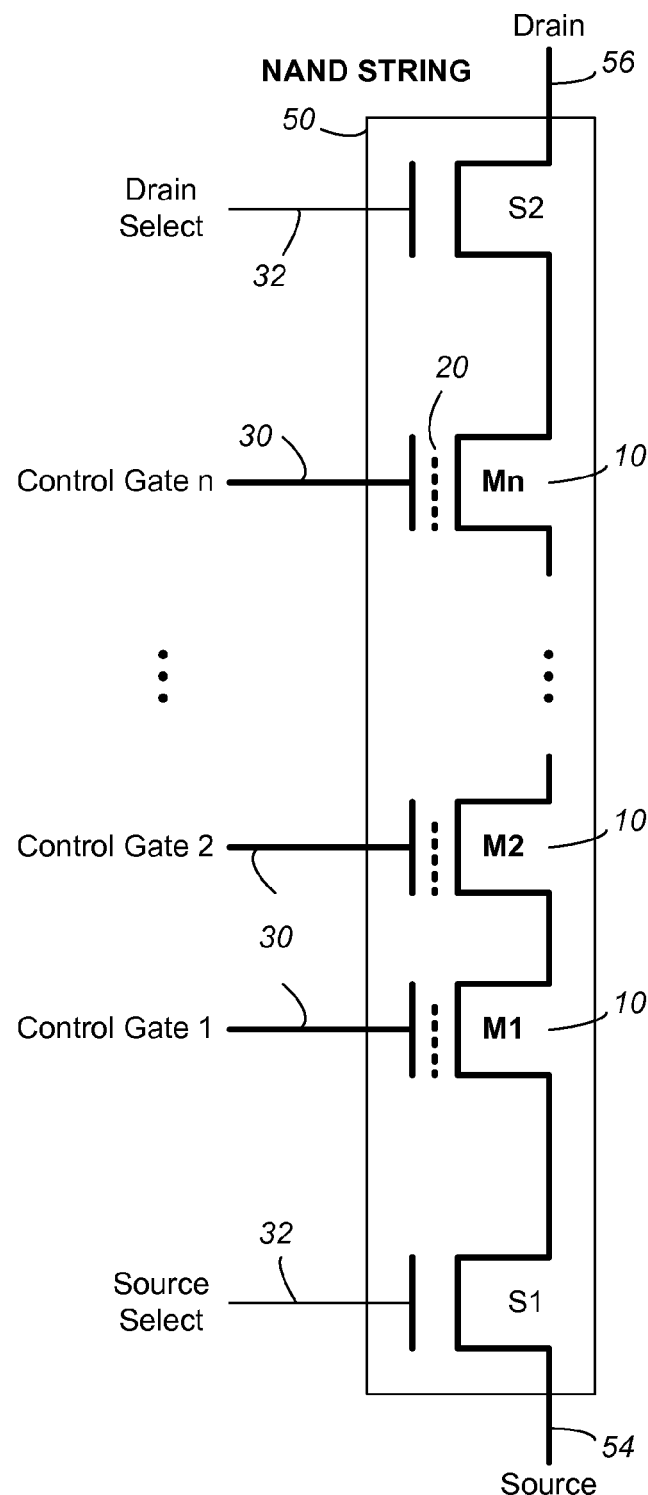
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
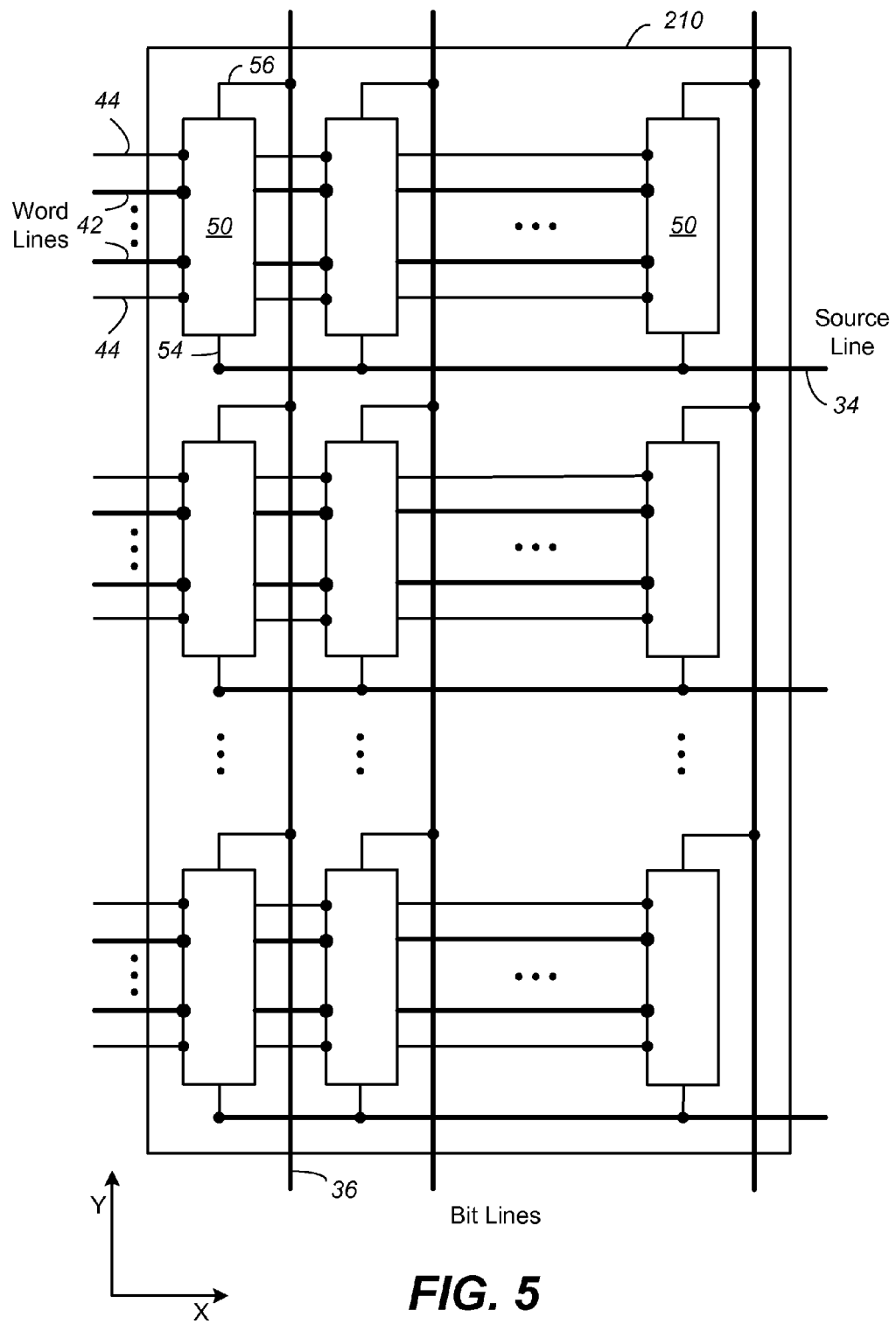
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
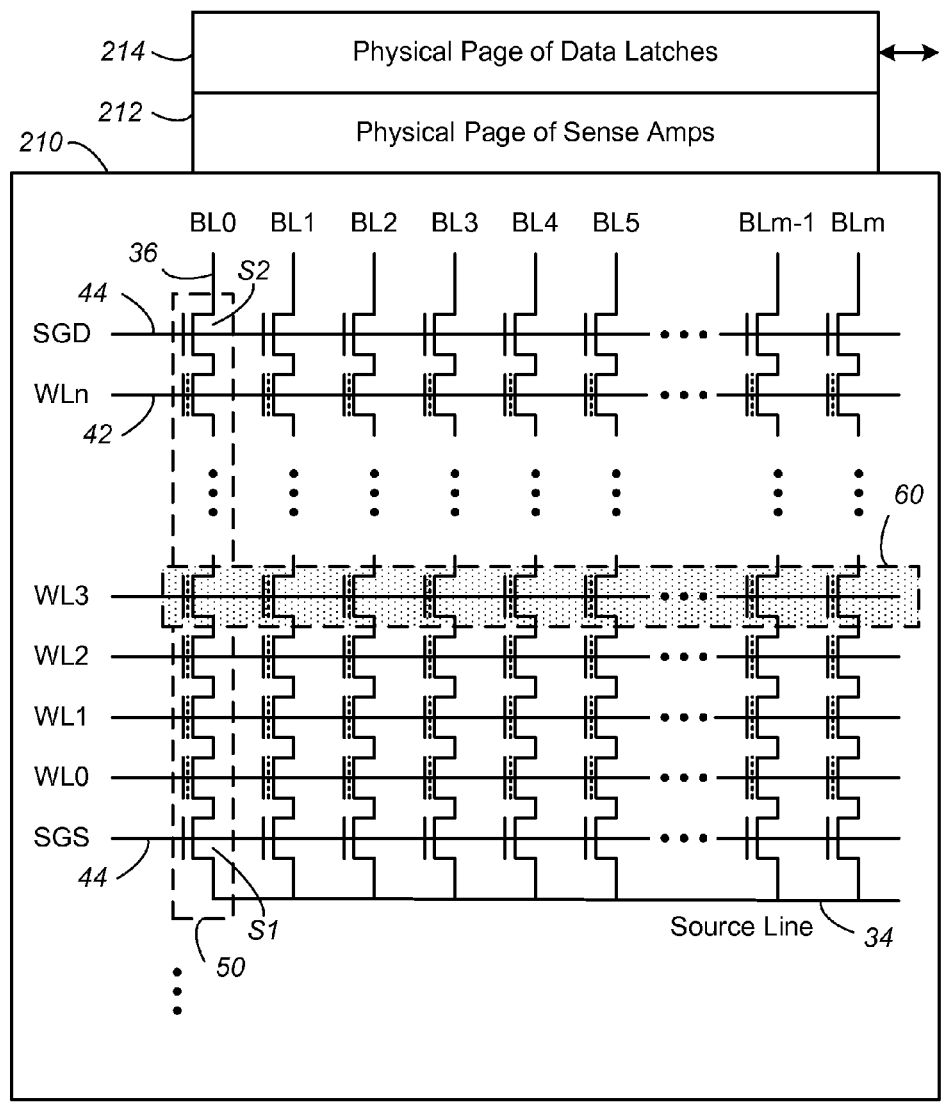
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
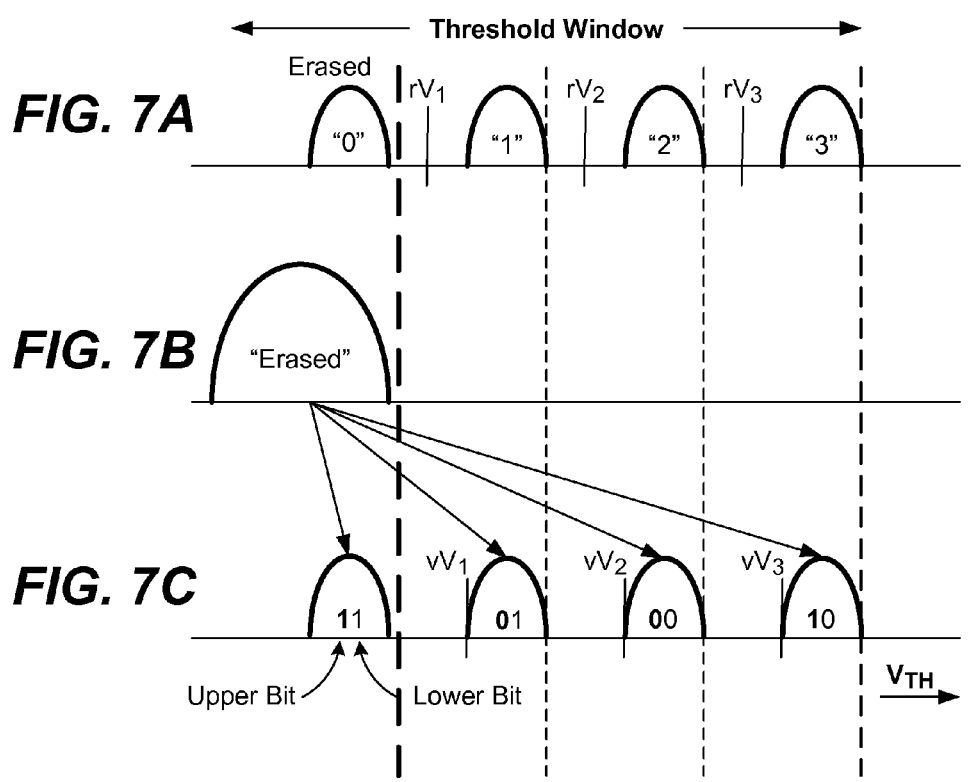
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
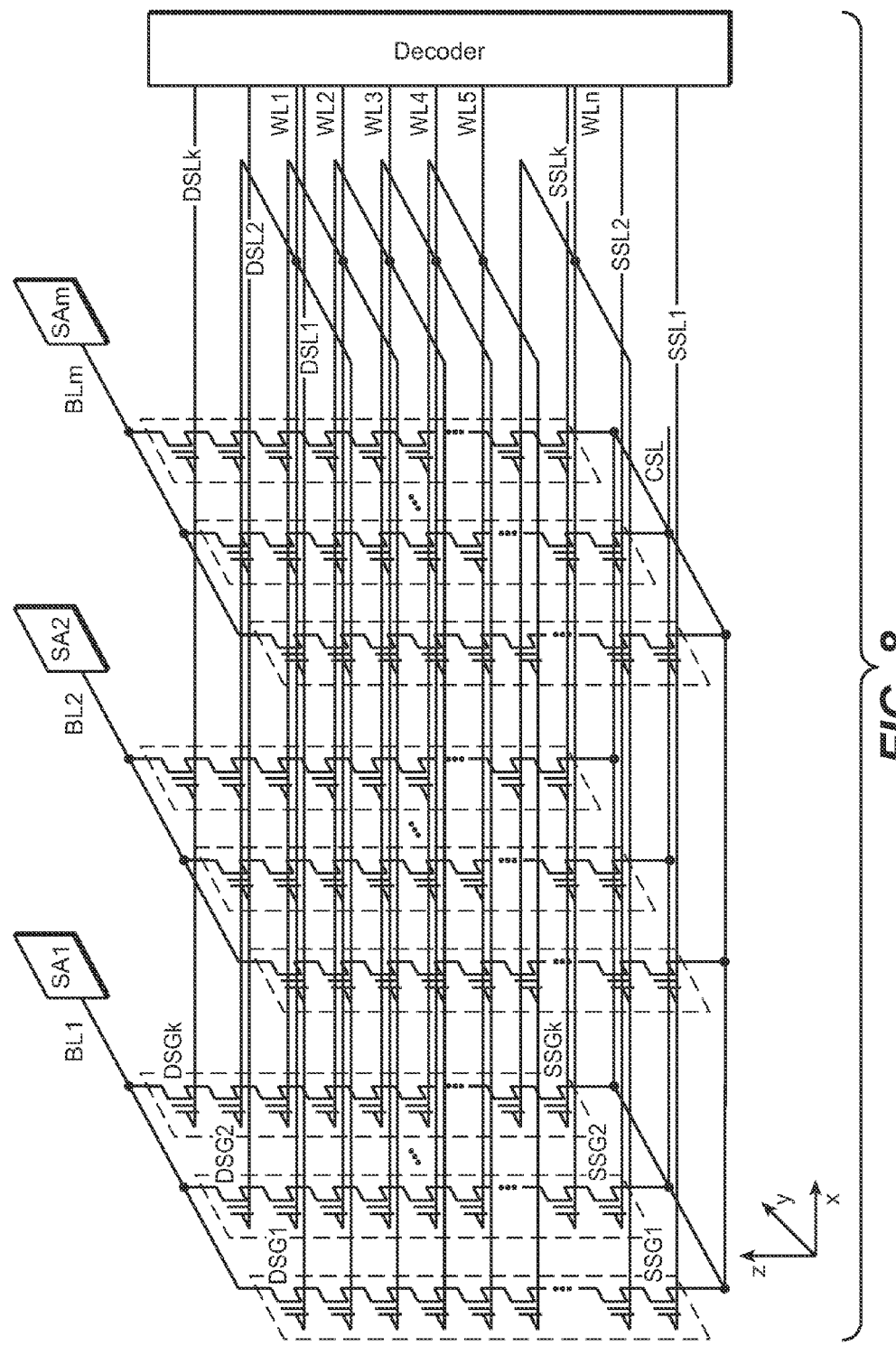
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
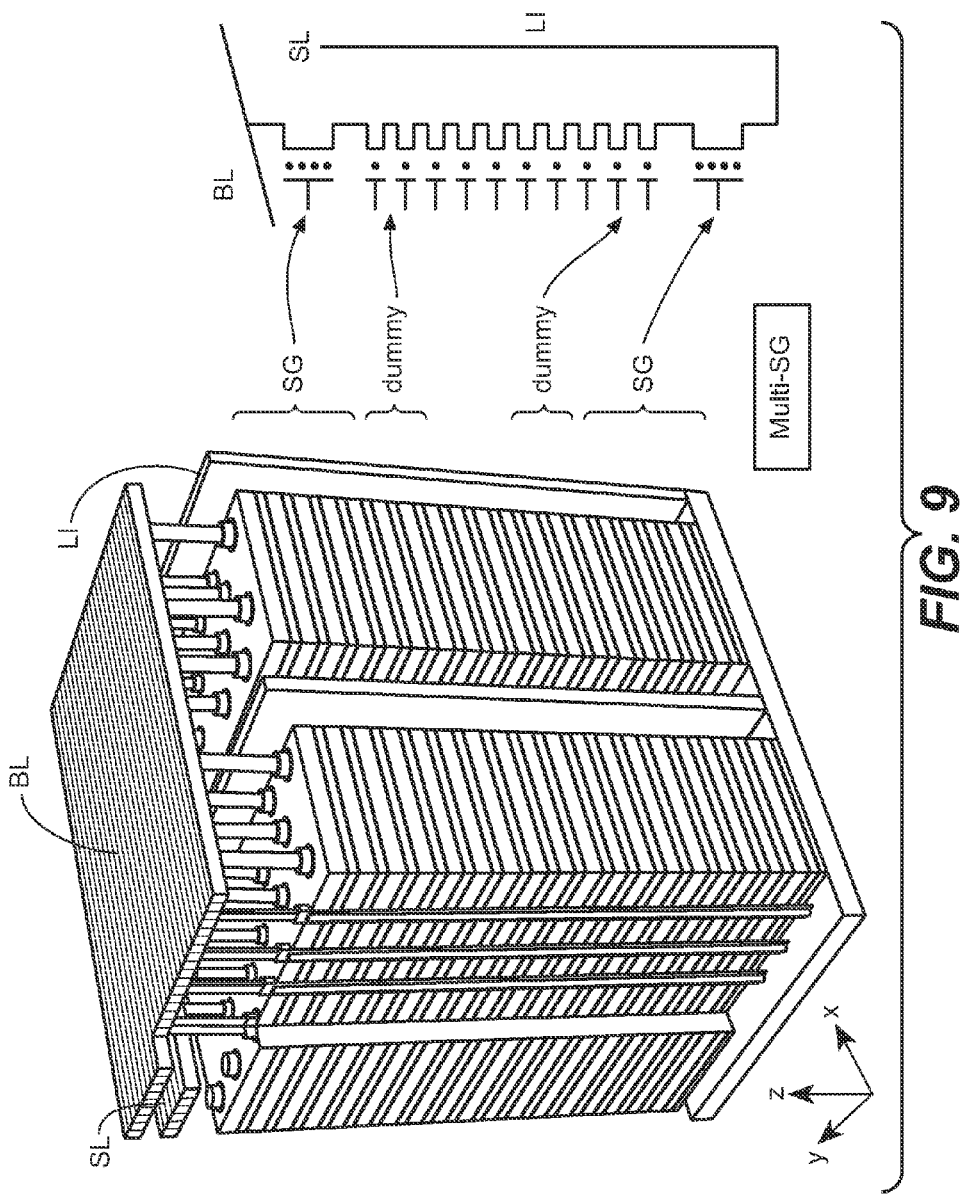
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
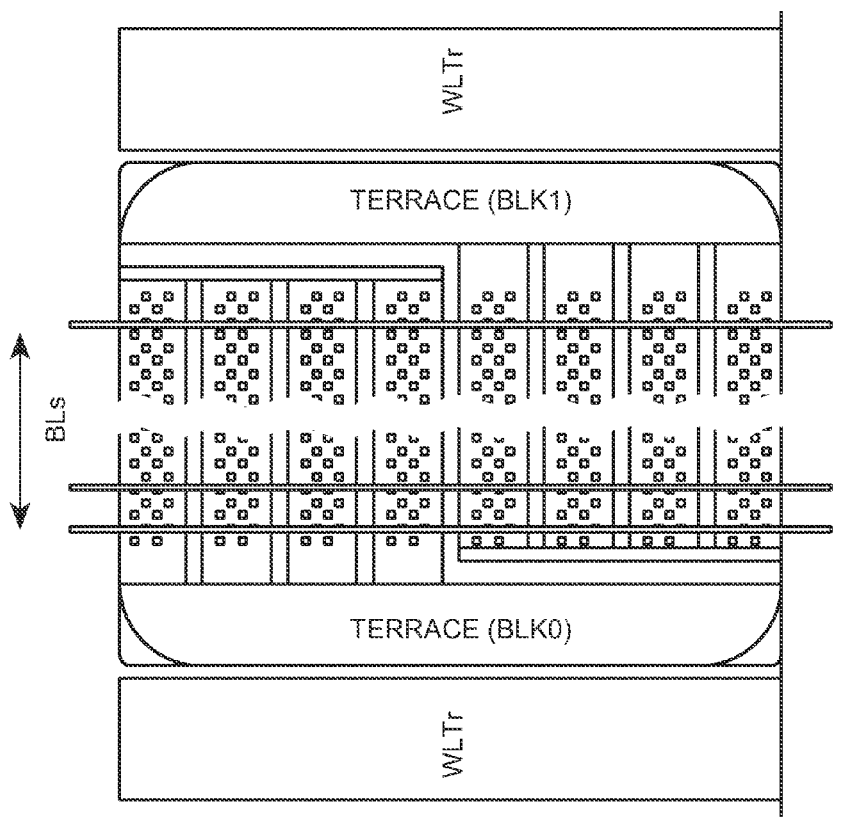

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
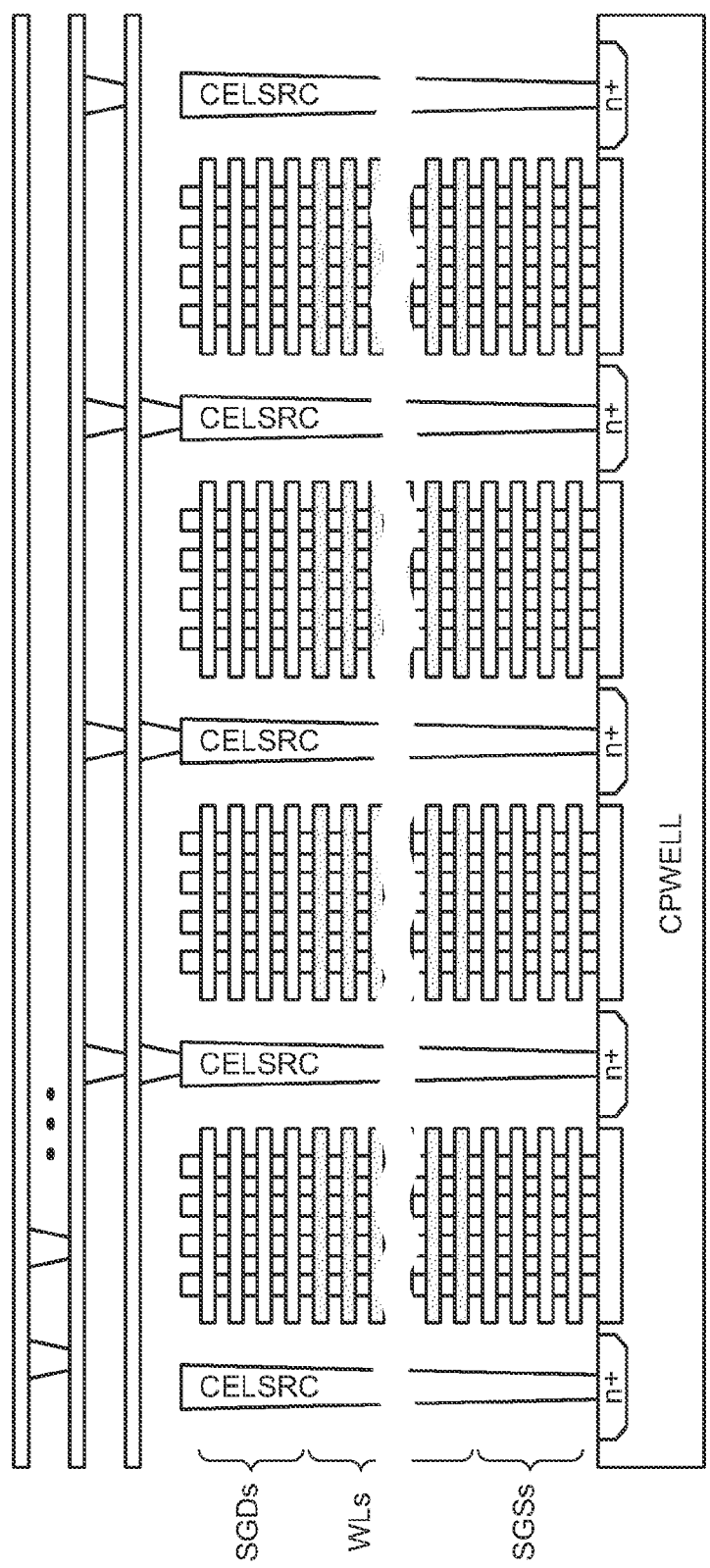

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
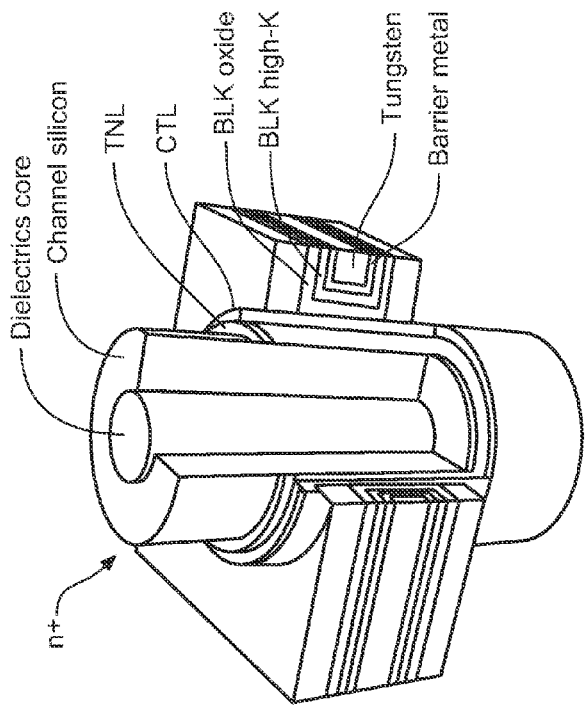

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Efficient Wide Range Bit Counter

In non-volatile memory circuits, such as those described above, and numerous other application, integrated circuits employ counter to track events. In the non-volatile flash memory context, the number of reads to a physical address or the number of program erase cycles are regularly tracked for scrub, wear leveling, and other purposes. Another important use a bit/byte counter in NAND memory is to keep count error bits, as these are often of great importance in deciding a stop point of programming or a program verify, deciding programming or verify start voltage (as used in smart verify techniques), deciding error bits for testing, deciding dynamic read level, detecting word line failures, and so on.

During operation or at test times, the circuit may need to count large numbers of bits. This consumes test time or operation time, directly degrading system performance and increasing test costs. For comparison purposes, it is often only the first or first several significant digits of these counts that are needed, while errors in lower count bits are often not important. Often, it is rather the time to reach the count that is more important. For many of the counters' uses, high counts are preferred because the result is less affected by noise levels. For example, deciding on a programming verify termination based upon a small bit count might be misguided by slow bits. Other examples include the tracking of cell threshold voltage (Vt) distributions, a technique to find optimal read levels based on these distributions, and erratic programming detection, that detects programming problems based on counts of cells in Vt intervals usually located at troughs of the Vt distribution. The following presents a scheme and circuit structure to count large number of bits quickly and a with small layout area, resulting in higher system performance, better memory endurance and lower costs.

Figure 13:
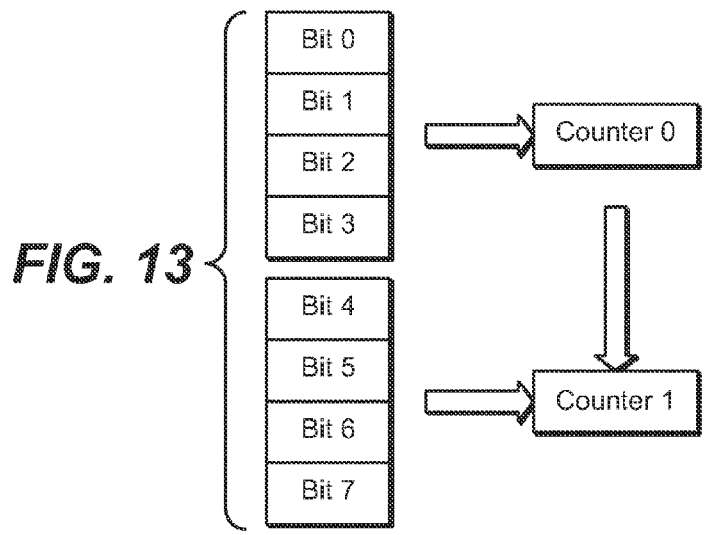
FIG. 13 is illustrates the use of one sub-counter to extent another sub-counter.

The general idea can be illustrated with respect to the simple example illustrated in FIG. 13. In this example, a counter is formed of two 4-bit sub-counters, Counter 0 of bits 0-3 and Counter 1 of bits 4-7. Each of these counts a subset of some event. For example, bits 0-3 of Counter 0 could track the number of error bits from the left side of a memory array and bits 4-7 could track the number of events coming from the right side. As long as neither counter saturates, the total count is just the sum of the value of Counter 0 plus the value of Counter 1. If one of the counters overflows, the other of the counters is used to extend the one that has overflowed. For example, if Counter 0 overflows first, counter 1 is cleared and used as extension of counter 0. The count is then taken as the value of the (extended) Counter 0, increased by a factor of 2. Similarly, if Counter 1 overflows first, it would take over Counter 0. If the count is maintained in the format of a significand$\times 2^{exponent}$ format, the count is the value of the extended counter with the exponent increased by 1 (significand$\times 2^{exponent+1}$).

Although the count determined in this way may not be completely accurate, it will save space and provide a good approximation, as long as the two sub-counts are reasonably similar, with half the counter space. Here two sub-counters are used, but more generally, the technique can be extended to more counters each tracking a corresponding sub-count. As the sub-counters overflow, the saturated counter can be extended with others of the sub-counts, with the resultant sub-count scaled accordingly to approximate the total count. Additionally, in a more general embodiment, the sub-counters can have differing capacities; for example, this sort of asymmetric arrangement could be used if the sub-counters are responsible for differing sized subsets of events or if they were different, but to some extent correlated, events.

Figure 14:
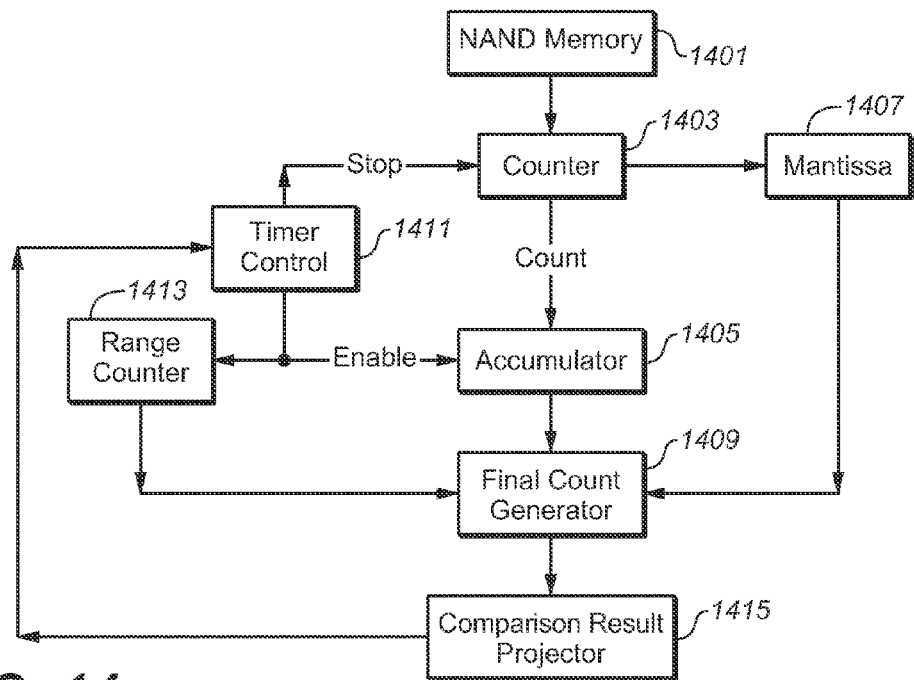
FIG. 14 is a block diagram of an implementation of the counter on a NAND memory circuit.

FIG. 14 is a block diagram of an implementation of the counter on a NAND memory circuit. The memory array, including any sensing circuitry or other circuitry involved in providing the count, is represented at 1401. The counter 1403 is then is made up of the sub-counters each responsible for a corresponding event subset, as described with respect to FIG. 13. The count is then passed on to the accumulator 1405, where prior to overflow this will reflect the sum of the counts and after overflow this will reflect the expanded count of the counter that over flowed. The block 1407 will reflect whether the count one of the counters has overflowed and that value in the 1405 needs to be adjusted (i.e., multiplied by 2) or not. At the Final Count Generator 1409 the count is determined either as the sum of the counts (if no overflow) or the expanded count scaled up by 2.

A timer control 1411 enables the accumulator. As described in subsequent figures, the count may be formed sequentially over a series of ranges, in which case a range counter 1413 can be included. If there is a range counter 1413, this can also be enabled by the timer control 1411 as well. The range counter 1413 keeps track of how many of the ranges have been included by the accumulator, so that, if needed, the final count can be adjusted in 1409 based on how many of the ranges were covered in the count. The result is then compared in 1415.

FIG. 15 illustrates having multiple ranges doing the count. The count is broken up into 16 ranges in this example, where each range is scanned and counted sequentially. In the memory circuit example, each range could correspond to a set of bit lines arranged into "tiers" of the memory array of 1401. Upon completion of each range, the count is swept from the counter 1403 into accumulator 1405. The range counter 1413 is incremented by 1 and the process moves on the next range until the count is completed, unless terminated early. Upon early termination, whether due to an interrupt command, reaching a maximum time, overflow or the (expanded) counter, or improper shutdown, the scan is terminated. The final count result is generated with the count in accumulator 1405, range counter 1413, and bit-counter mantissa 1407. The result of the accumulator 1409 is projected and compared with pass/fail criteria at 1415 and counting can be terminated.

In the case of a time-out request, the current scan will finish the range and then the final result is calculated. This is illustrated in FIG. 16A, where the time-out request comes in during the third range, which is then completed. The final result is then calculated by scaling up the three read ranges to yield the projected value of all of the ranges.

Upon abort request, the current scan aborts immediately and its result discarded, with the final result being calculated from the range completed. This is illustrated with respect to FIG. 16B, where the abort request comes in during the fourth range, which is then discarded and the final result projected from the three completed ranges.

Figure 17:
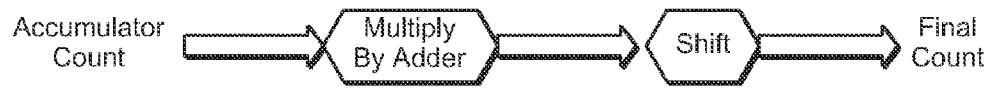
FIG. 17 is a schematic representation of efficient techniques for generating the final result when the count is based on less than all of the ranges.

A efficient techniques for generating the final result when the count is based on less than all of the ranges is schematically illustrated with respect to FIG. 17. The count from the accumulator is multiplied by an adder and then shifted, providing the final count. The number of times that the partial result is added to itself and the number of bits it is shifted, based on the number of ranges used, is shown in Table 1. The result, relative to 1 (no error) and the corresponding amount of error is also shown.

TABLE 1

|  | Multiply by Adding | Then Shift | Result | Error |
|---|---|---|---|---|
| 1/16 | 1 | 4 | 1 | 0% |
| 2/16 | 1 | 3 | 1 | 0% |
| 3/16 | 11 | −1 | 1.03 | −3% |
| 4/16 | 1 | 2 | 1 | 0% |
| 5/16 | 13 | −2 | 1.02 | −2% |
| 6/16 | 11 | −2 | 1.03 | −3% |
| 7/16 | 19 | −3 | 1.04 | −4% |
| 8/16 | 1 | 1 | 1.00 | 0% |
| 9/16 | 15 | −3 | 1.05 | −5% |
| 10/16 | 13 | −3 | 1.02 | −2% |
| 11/16 | 3 | −1 | 1.03 | −3% |
| 12/16 | 11 | −3 | 1.03 | −3% |
| 13/16 | 5 | −2 | 1.02 | −2% |
| 14/16 | 19 | −4 | 1.04 | −4% |
| 15/16 | 9 | −3 | 1.05 | −5% |

For example, a single tier (1/16) would just need to multiplied by 16, corresponding to a shift of 4 (i.e., $2^4$) and would have no error. Similarly, for 2 tiers (2/16) the result needs to multiplied by 8, a shift of 3 bits, and have no error. For 3/16, the result if multiplied by adding it to itself 11 times, yield 11×(3/16)=33/16; which is then shifted by −1 to give 33/32=1.03, an error of −3%. To take another example, for 14/16, this is added to itself 19 times, shifted by −4 (i.e., multiplied by $2^{+4}$), so that the result is scaled by 19/16. As 13/16*19/16=249/256, the error is 2%.

Consequently, the techniques of this section can support a wide range of counts with scientific notation. It allows for the counting scheme to be dynamically altered to maintain a balance between accuracy and performance and can accommodate early termination to allow it to fit timing budget.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. An event counter circuit formed on an integrated circuit, comprising:

a first counter having a first capacity connected to count a number of occurrences of a first sub-set of a first event;

a second counter having a second capacity connected to count a number of occurrences of a second sub-set of the first event; and logic circuitry connected to the first and second counters, wherein the logic circuitry provides the count of the number of occurrences of the first event as a sum of values of the first and second counters when neither of the first counter or the second counter has reached a respective capacity, and in response to a first one of the first and second counters reaching its respective capacity, the other of the first and second counters is used as an extension of the first one of the first and second counters, wherein the logic circuitry provides the count of the number of occurrences of the first event as the values of the first one of the first and second counters scaled according to the counters' relative capacities.

2. The event counter circuit of claim 1, wherein the first and second counters have the same capacity, and wherein in response to providing the count of the number of occurrences of the first event as the values of the first one of the first and second counters scaled according to the counters' relative capacities, the logic circuitry doubles the count of the first one of the first and second counters.

3. The event counter circuit of claim 1, wherein the integrated circuit comprises a non-volatile memory circuit.

4. The event counter circuit of claim 3, wherein the first event is a data error.

5. The event counter circuit of claim 3, wherein the first event is a programming cycle in a write operation.

6. The event counter circuit of claim 3, wherein the count of the number of occurrences of the first event is used to determine whether to terminate a write operation.

7. The event counter circuit of claim 3, wherein the count of the number of occurrences of the first event is used to determine whether to terminate a program verify operation.

8. The event counter circuit of claim 3, wherein the count of the number of occurrences of the first event is used to determine data states to verify during a write operation.

9. The event counter circuit of claim 3, wherein the count of the number of occurrences of the first event is used to determine whether the non-volatile memory circuit has a defect.

10. The event counter circuit of claim 3, wherein the non-volatile memory circuit is formed according to a NAND type of architecture.

11. The event counter circuit of claim 3, wherein the non-volatile memory circuit is a monolithic three-dimensional semiconductor memory device comprising: memory cells arranged in multiple physical levels above a silicon substrate; and a charge storage medium.

12. The event counter circuit of claim 3, wherein the first and second sub-sets of the first event correspond to occurrences of the first event in distinct physical elements of an array of memory cells of the non-volatile memory circuit.

13. The event counter circuit of claim 1, wherein the count of the number of occurrences of the first event is counted sequentially as a series of partial counts and wherein, in response to the count of the number of occurrences of the first event being terminated prior to completing the series of partial counts, the logic circuitry provides an approximated value of the count of the number of occurrences of the first event for a complete series of partial counts.

14. The event counter circuit of claim 13, wherein the logic circuitry generates the approximated values of the count of the number of occurrences of the first event from completed ones of the series of partial counts by a combination of a multiplication operation and a shift operation performed on a sum of the series of partial counts.

15. The event counter circuit of claim 1, wherein the logic circuitry provides the count of the number of occurrences of the first event in a format of a significand times two to the power of an exponent.

16. The event counter circuit of claim 15, wherein the logic circuitry scales the count of the number of occurrences of the first event by increasing the value of the exponent.

* * * * *